(12) United States Patent
Feldbauer

(10) Patent No.: US 7,122,221 B2
(45) Date of Patent: Oct. 17, 2006

(54) METHOD AND APPARATUS FOR METAL VAPOR COATING

(75) Inventor: Stephen L. Feldbauer, DuBois, PA (US)

(73) Assignee: Danieli Technology, Inc., Cranberry Township, PA (US)

(*) Notice: Subject to any disclaimer, the term of this patent is extended or adjusted under 35 U.S.C. 154(b) by 109 days.

(21) Appl. No.: 10/483,112

(22) PCT Filed: Jul. 25, 2002

(86) PCT No.: PCT/US02/23789

§ 371 (c)(1),
(2), (4) Date: Jan. 7, 2004

(87) PCT Pub. No.: WO03/012161

PCT Pub. Date: Feb. 13, 2003

(65) Prior Publication Data
US 2004/0154539 A1   Aug. 12, 2004

Related U.S. Application Data

(60) Provisional application No. 60/309,460, filed on Aug. 1, 2001.

(51) Int. Cl.
C23C 16/06   (2006.01)

(52) U.S. Cl. ...................... 427/250; 427/251

(58) Field of Classification Search ................ 427/250, 427/251
See application file for complete search history.

(56) References Cited

U.S. PATENT DOCUMENTS

| | | | | |
|---|---|---|---|---|
| 4,477,291 A | * | 10/1984 | Singer | 148/531 |
| 4,513,033 A | * | 4/1985 | Patil et al. | 148/533 |
| 4,713,262 A | | 12/1987 | Yasunaga et al. | 427/130 |
| 4,950,643 A | | 8/1990 | Agostinelli et al. | 505/1 |
| 5,383,969 A | * | 1/1995 | Teverovsky et al. | 118/719 |
| 5,403,620 A | * | 4/1995 | Kaesz et al. | 427/252 |
| 5,439,744 A | * | 8/1995 | Claar et al. | 428/408 |
| 5,523,126 A | | 6/1996 | Sano et al. | 427/575 |
| 5,614,346 A | * | 3/1997 | Adel et al. | 430/111.3 |
| 6,010,749 A | * | 1/2000 | Goldman | 427/248.1 |
| 6,113,982 A | * | 9/2000 | Claar et al. | 427/248.1 |
| 6,117,772 A | * | 9/2000 | Murzin et al. | 438/681 |

* cited by examiner

Primary Examiner—Bret Chen
(74) Attorney, Agent, or Firm—Armstrong, Kratz, Quintos, Hanson & Brooks, LLP

(57) ABSTRACT

A method and apparatus for coating a substrate (4) with a metal coating by vaporizing the metal in an enclosure (1) containing a selected gas and the substrate. The vaporized metal is deposited on the surface of the substrate either in a solid or molten form depending on the temperature of the substrate relative to the melting point of the metal being deposited. Alloying of the substrate and coating metal are possible with various postcoating heat treatments.

24 Claims, 4 Drawing Sheets

METHOD AND APPARATUS FOR METAL VAPOR COATING

This application claims the benefit of U.S. Provisional Application No. 60/309,460, filed Aug. 1, 2001.

FIELD OF THE INVENTION

The present invention is a method and apparatus for coating a substrate with a metal coating by vaporizing the metal in an enclosure containing a selected gas and the substrate, then depositing the vapor on the surface of the substrate.

BACKGROUND OF THE INVENTION

Methods presently being carried out for coating substrates with metal, which are practical on a scale which would include, for example, continuous strip substrates in coil form, include electroplating and hot-dip coating. Metals commonly electroplated on such a scale include zinc, tin and chromium. Metals commonly hot-dip coated on such a scale include zinc, tin, aluminum, and lead.

Coating a substrate with a metal by electroplating requires a large capital expenditure for power supply, power control equipment, electrolytic cells, and the like. Operating expenses are high, as significant electrical power is required. Maintaining cell electrodes and electrolyte baths is difficult.

Coating a substrate by hot-dip coating requires less of a capital expenditure than electroplating, however, operating expenses are high for heating the substrate prior to its entrance into the molten bath, and maintaining the molten metal bath and strip handling equipment in the molten bath.

On a smaller scale than the above described prior art processes, vapor deposition in a vacuum is used for depositing many different metals on various substrates. However, maintaining a vacuum on a scale required for coating substrates, such as continuous strip in coil form, is not practical.

While coating a substrate with a metal by electroplating and hot-dip coating processes are widely used, and produce a good quality finished product, the capital expenditure and high operating expenses make an alternative process desirable.

OBJECTS OF THE INVENTION

It is an object of the present invention to provide a process for coating a substrate with a metal, with use of apparatus which is not excessively complex and expensive, and in which the operating cost is not excessively high.

It is another object of the present invention to provide a method wherein different metals can be uniformly coated on various substrates, and the coating thickness can be easily controlled.

It is still another object of the present invention to provide a method wherein the phase of the coating, when deposited, can be selected and the degree of alloying of the metal with the substrate can be controlled.

SUMMARY OF THE INVENTION

The present invention is a method and apparatus for coating a substrate with a metal coating, in which a substrate is provided in a closed heated chamber and a gas atmosphere is provided in the chamber. A vapor of the metal to be coated on the substrate is introduced into the chamber so as to contact the substrate and be deposited on the substrate so as to form a metal coating on the substrate.

The metals for coating include zinc, tin, aluminum, chromium, and alloys of those metals. Nitrogen, helium, hydrogen, and argon gas can be selected as the atmosphere in the chamber.

In one embodiment of the invention the substrate is at a temperature below the melting point of the coating metal and the coating metal vapor sublimates on the substrate to form a solid coating. In another embodiment, the substrate is at a temperature above the melting point of the coating metal, but below the temperature of the chamber atmosphere, and the coating metal vapor condenses on the substrate to form a molten metal coating.

In still another embodiment of the invention, the coated substrate is held at a selected temperature for a selected period of time after depositing the coating so as to form an alloy of at least a portion of the metal coating with the material of the substrate.

DESCRIPTION OF THE DRAWINGS

The invention will become more readily apparent from the following description of preferred embodiments thereof shown in the accompanying drawings, wherein.

DETAILED DESCRIPTION

Figure 1:
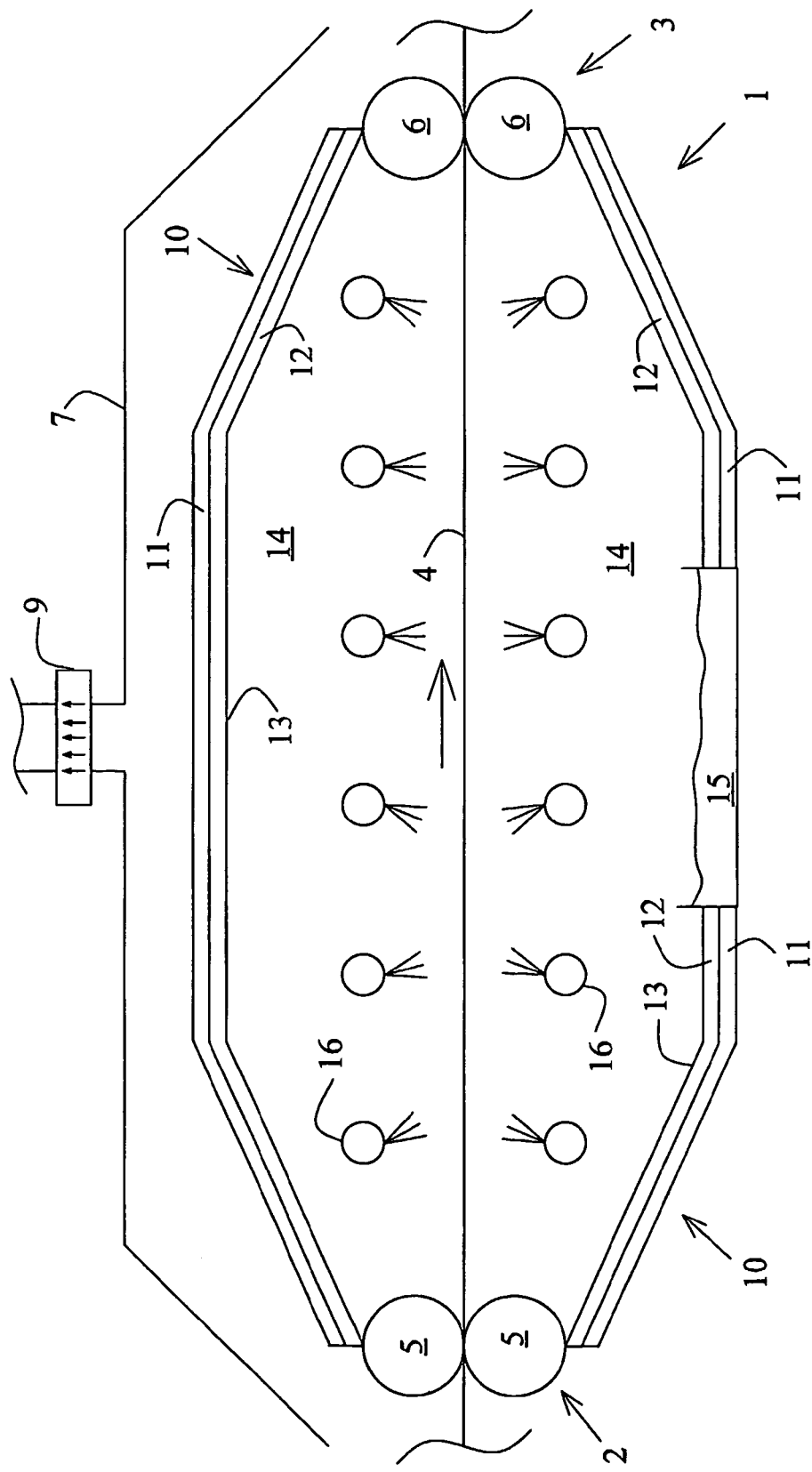
FIG. 1 is a schematic illustration of the present invention for coating a continuous strip substrate with a metal coating, wherein a combined means is provided for both introducing a gas and forcibly directing the gas and a coating metal vapor toward the substrate surface.

The present coating process is carried out in a closed chamber 1, as illustrated in FIG. 1. The chamber ideally encloses the atmosphere of the coating process, discussed below, and prevents entry of any ambient air or loss of any of the coating process atmosphere. Any means for providing an entry seal 2 or an exit seal 3 for entry and exit of a continuous strip substrate 4 is useable. In the preferred embodiment, depicted in FIG. 1, entry rolls 5 and exit rolls 6 are provided as entry and exit seals.

In order to capture and properly handle any coating process atmosphere which might escape from the closed chamber through seals 2 and 3, or which might escape in any other manner, a hood 7 is provided above the chamber. Hood 7 includes a duct for use in conveying the captured process atmosphere to a treatment means (not shown) for removing any products, which are hazardous to the environment, before exhausting the gas to the atmosphere. A fan 9 can be used in some applications to improve the operation of the hood. A water scrubber can be used as the means for treating the gas prior to exhausting it to the atmosphere.

The substrate 4, in continuous strip form, must have a surface which is substantially free of oxides and free of any material, such as oil or the like, which may have been applied to the strip surface to prevent oxidation during previous processing steps carried out on the strip. Surface preparation steps, upstream of the closed chamber 1, can include a pickling operation or cleaning operation, or the present coating process can be carried out as a step in-line with a continuous caster of thin metal strip.

In closed chamber 1 of the invention, chamber walls 10 are preferably insulated at 11 to prevent loss of heat to the surroundings of the chamber. An interior layer of the chamber 12, having a surface 13, which is in contact with a coating process atmosphere 14 of the furnace, is preferably provided with a means for heating and means for controlling the temperature thereof, so as to prevent coating the chamber walls with the coating metal which is discussed below. The means for heating the interior layer of the furnace can include electrical resistance heating, combustion gas heating, or other suitable means. The temperature at which surface 13 is maintained is discussed below and is dependent on the metal being coated on the substrate.

The atmosphere within closed chamber 1 is prepared by purging the chamber of air with a selected gas so as to eliminate substantially all of the air present in the chamber. Preferred gases for purging and carrying out the coating process are nitrogen, helium, hydrogen, and argon.

In order to provide vapors of the metal to be coated on the substrate, an open heated bath of the metal is provided preferably in direct communication with the closed chamber. An open heated bath is shown at 15 of FIG. 1.

The process of the invention is a gas phase mass transfer limited process. Therefore, the greater the degree of turbulence within the chamber, the greater the amount of metal vapor which is brought into contact with the substrate surface. The turbulence can be generated by independent means or can be in combination with injectors which inject the gas into the closed chamber. In FIG. 1, gas injectors 16 are provided both above and below surfaces of the substrate and the gas is supplied to the injectors. In the embodiment of FIG. 1, the coating process atmosphere within the closed chamber, which is made up of the gas and the metal vapor, is made to be turbulent by the gas injectors 16. The injectors are preferably located uniformly and are provided with a nozzle or the like to provide a substantially uniform injection pattern.

Figure 2:
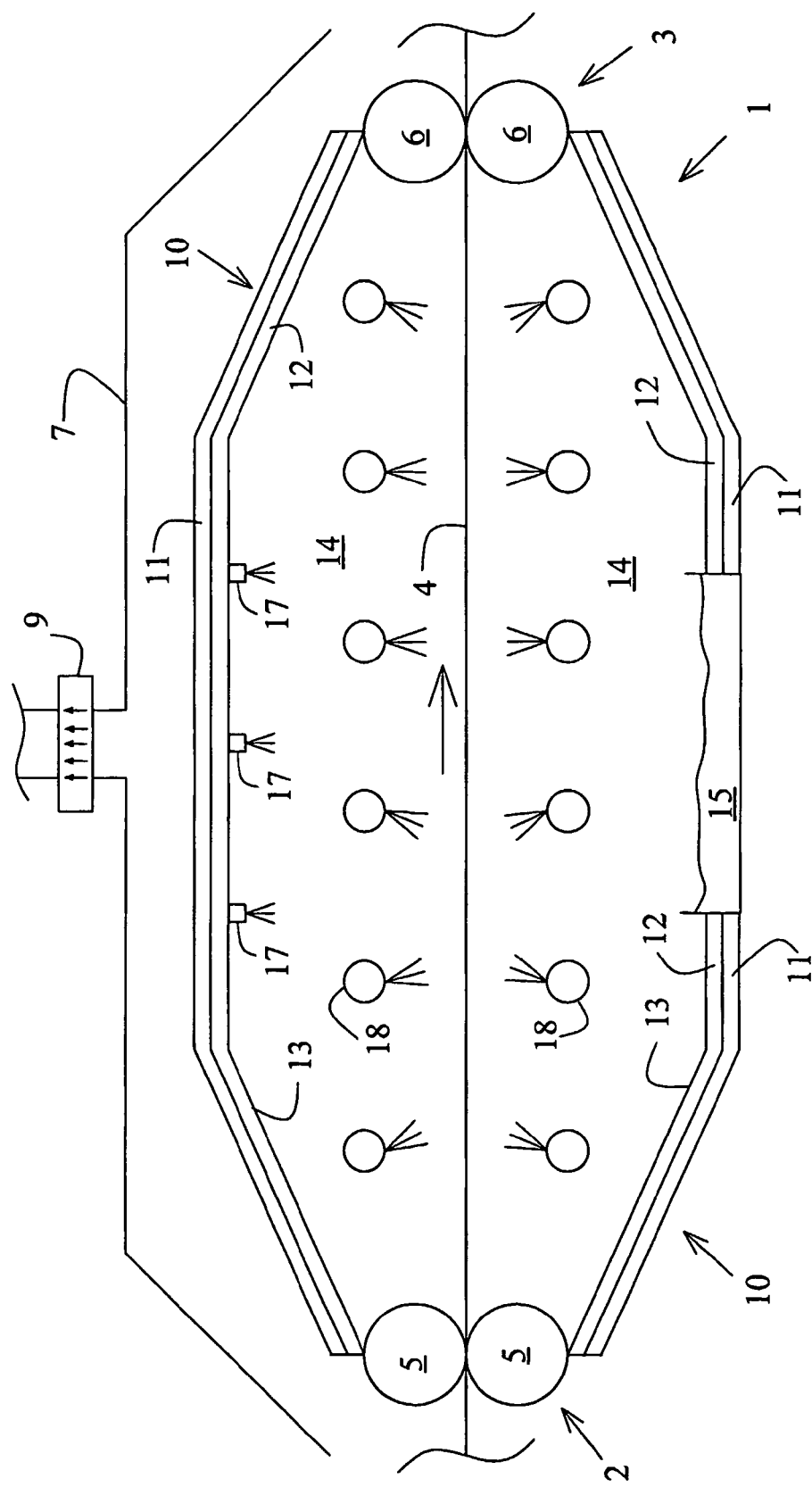
FIG. 2 is a schematic illustration of the invention for coating a continuous strip substrate with a metal coating, wherein separate means are provided for introducing a gas to the closed chamber and for forcibly directing a coating metal vapor toward the substrate surface.

In a second embodiment, which is depicted in FIG. 2, gas injectors are provided at 17 for the primary purpose of maintaining the desired gas pressure, and separate turbulence creating means 18 are provided for generating the turbulence. Such means can be fans or the like.

Coating the substrate with a metal can take place by different mechanisms depending on the temperature of the substrate in relation to the melting point of the coating metal. In order to describe the process, the coating of continuous strip steel with zinc will be described. The melting point of zinc is 420° C. and the boiling point of zinc is 917° C. Zinc vapor which is introduced from an open heated bath into a heated chamber containing a selected gas, such as nitrogen, has a vapor pressure, when both the temperature within closed chamber and the zinc metal bath are at the same temperature, ranging from slightly greater than zero atmosphere at 420° C. to slightly greater than one atmosphere at 917° C.

In a first method of the invention continuous steel strip substrate is introduced into the closed chamber through entry seal 2 with the substrate at a temperature below the temperature of the zinc bath and the temperature of the atmosphere of the closed chamber (917° C.), and above the melting point of zinc (420° C.). With such a temperature, the zinc vapor condenses onto the surface of steel substrate as a coating of molten zinc. The condensing process occurs because the equilibrium vapor pressure of zinc at 420° C. is approximately $2 \times 10^{-4}$ atmospheres and ranges to less than one atmosphere at a temperature below 917° C.

In a second method of the invention, the temperature of the substrate is below the 420° C. melting point of zinc during travel through the closed chamber, and virtually all of the zinc vapor that comes into contact with the substrate deposits by sublimation as a solid zinc coating.

During the coating process, if the internal wall surface 13 of the closed chamber is at the same or higher temperature than the molten zinc bath, the zinc vapor will not condense out onto the surface of the internal walls.

As mentioned above, the process is a gas phase mass transfer limited process and therefore the greater the turbulence and thus the greater the amount of zinc vapor coming into contact with the substrate surface, the greater the amount of zinc deposited on the substrate per unit time. In order to maximize the deposit rate, so as to be able to deposit a desired thickness of metal in as short a time as possible and in as short a chamber as possible, a high amount of turbulence is desirable. A combination of the gas injectors 16 of FIG. 1, and the turbulence providing means 18 of FIG. 2 can be combined to increase the turbulence.

In either of the types of deposition, the amount of metal vapor provided to the closed chamber is dependent on the amount of heat added to the molten metal bath, the surface of which is in communication with the closed chamber. By providing more heat to the molten bath, the temperature of the bath will not go above the boiling point of the metal. The amount of metal vapor going into the process atmosphere is directly dependent on the amount of heat supplied to the bath. Therefore, in order to increase the deposition rate to allow for a decrease in the length of the closed chamber, a high output metal bath heating means is desirable.

Regardless of whether the metal coating is deposited as a solid or in a molten state, a further processing step can form an alloy of at least a portion of the coating with the material of the substrate. That step can be carried out in a number of different ways, for example, in-line with the present metal coating process, either within the closed chamber or downstream of the closed chamber. Other methods can be used, which are not in-line with the coating process, which include additional heating of the coated substrate in a continuous heating line or heating the coated substrate in coil form. In the continuous mode, whether in-line with the coating process or in a separator operation, induction heating of the coating metal and surface of the substrate can efficiently form an alloyed layer of material.

Figure 3:
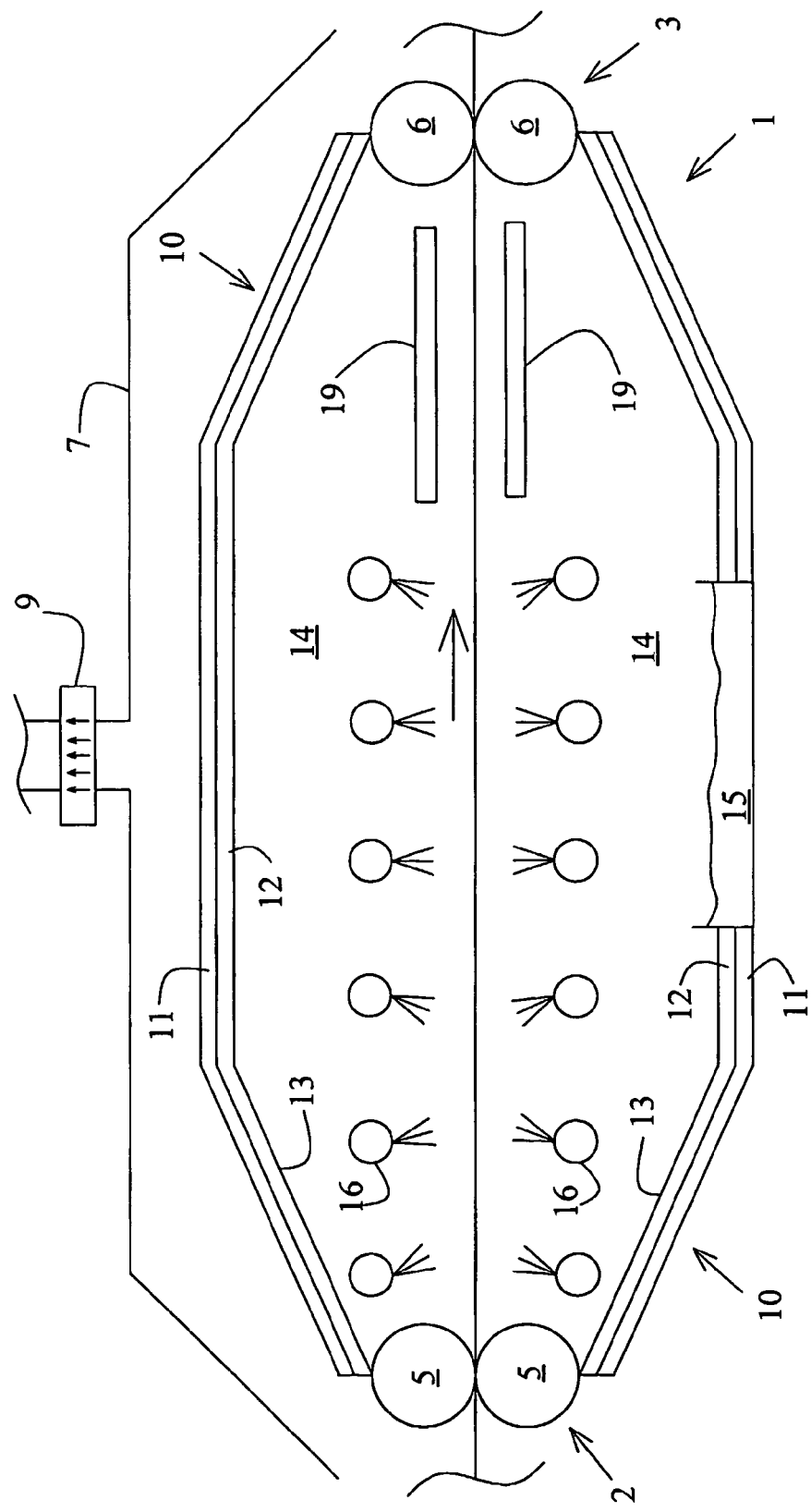
FIG. 3 is a schematic illustration of the invention for coating a continuous strip substrate with a metal coating and alloying that coating with material of the substrate.

FIG. 3 depicts a coating line wherein a high degree of turbulence is provided at a first portion of the chamber for efficient deposition of the metal coating, following by a second portion of the chamber in which primarily alloying of the deposited metal with the substrate takes place. Devices for heating the substrate and metal coating, such as radiant heaters 19, for example, can be provided in the second portion of the chamber to increase the temperature of the substrate and metal coating. If a means for heating is not provided, some alloying takes place due to the elevated temperature of the strip and the metal coating resulting from the coating process. Use of the coating process wherein the metal coating condenses on the substrate in the molten form would result in a thicker alloy layer because of the higher temperature of the strip.

Figure 4:
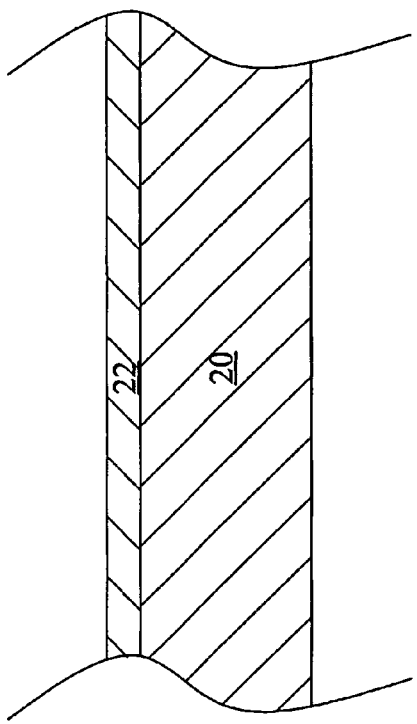
FIG. 4 shows a cross-section of a substrate and metal coating of the invention wherein coating metal vapor sublimates as a solid metal on the substrate surface.

Various types of metal coating are possible with use of the present invention. FIG. 4 depicts an embodiment wherein the metal coating is deposited on the substrate in solid form. In FIG. 4, substrate 20 has deposited thereon, solid metal coating 21. That embodiment results when the temperature of substrate 20 is at a temperature which is less than the melting point of the coating metal when deposition of the coating metal occurs.

Figure 5:
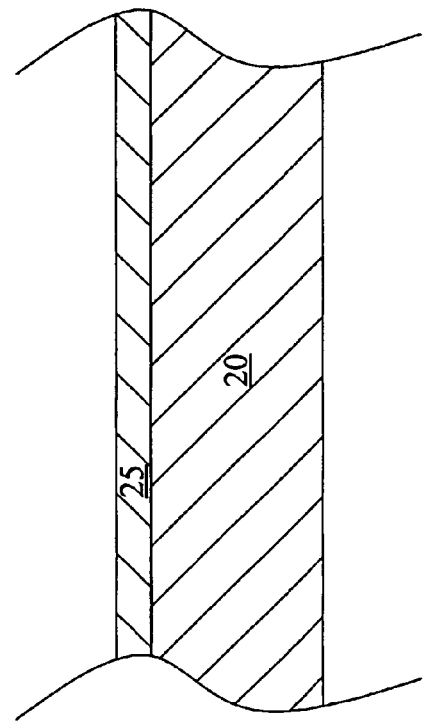
FIG. 5 shows a cross-section of a substrate and metal coating of the invention wherein coating metal vapor condenses as a molten metal on the substrate surface.

FIG. 5 depicts an embodiment wherein the metal coating is deposited on the substrate in molten form. In FIG. 5, substrate 20 has deposited thereon, molten metal coating 22. That embodiment results when the temperature of substrate 20 is at a temperature which is greater than the melting point of the coating metal when deposition of the coating metal occurs.

Figure 6:
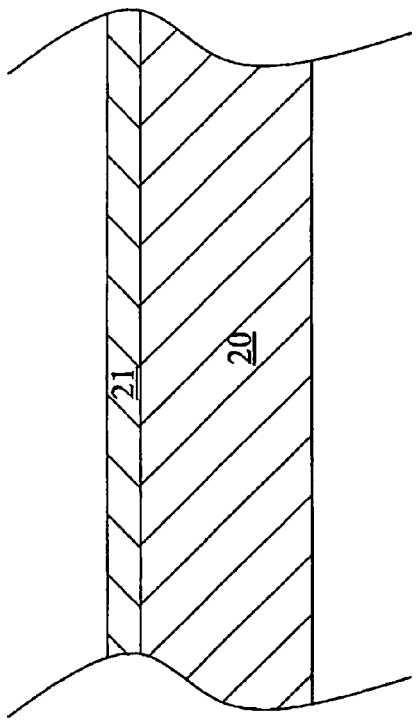
FIG. 6 is a cross-section of a substrate and metal coating of the invention wherein a metal coating is partially alloyed with material of the substrate.

FIG. 6 depicts an embodiment wherein the metal coating is partially alloyed with material of the substrate. The alloying can be carried out either in-line within closed chamber 1, in-line in a separate heating device, or in a separate operation which is not in-line with the coating process. In the process of FIG. 6, substrate 20 is coated by either coating method (solid or molten coating), followed by an alloying step wherein a portion of metal coating 23 is alloyed with material of substrate 20 to form alloy layer 24 which is intermediate substrate 20 and metal coating 23.

Figure 7:
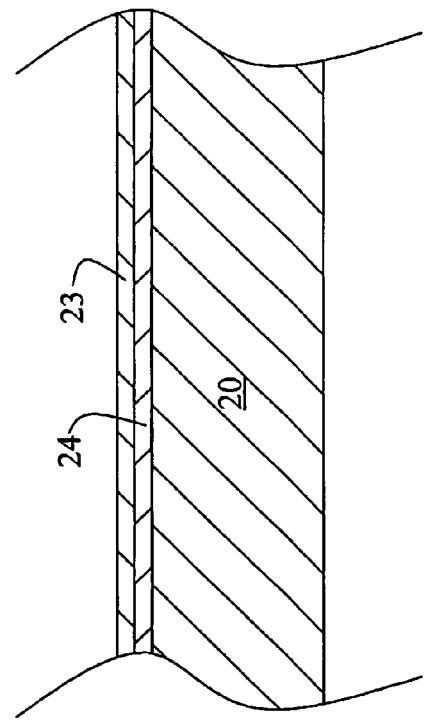
FIG. 7 is a cross-section of a substrate of the invention wherein a metal coating has completely alloyed with material of the substrate.

FIG. 7 depicts an embodiment wherein all of the metal coating is alloyed with material of the substrate. The alloying can be carried out either in-line within closed chamber 1, in-line in a separate heating device, or in a separate operation which is not in-line with the coating process. In FIG. 7, substrate 20 is coated by either coating method (solid or molten coating), followed by an alloying step wherein all of the metal coating is alloyed with material of substrate 20 to form surface alloy layer 25.

A preferred procedure for shutting down the coating system, so as to avoid depositing unwanted metal on surfaces of the system, is as follows. Firstly, while the closed chamber is maintained at the operating temperature, the source of the metal vapor is eliminated by either consuming all of the metal of the heated metal bath and removing the source of heat to the bath, or by removing the source of heat to the metal bath in order that the metal bath can solidify and cool. Secondly, allowing time for metal vapor in the closed chamber to condense onto the surface of the solidified coating metal bath. Thirdly, cooling the closed chamber by terminating heating of the interior layer 12 of the closed chamber.

The present metal coating process provides a continuous uniform metal coating. Because of the fact that the process is a vapor-based process, coating of substrate surfaces which may have a varied surface texture, still produces a continuous and uniform coating.

The method of the present invention is described above by describing the deposition of zinc on a continuous strip steel substrate. The process can be carried out in a similar manner on other substrate and with use of other coating metals. Coating metals include aluminum, chromium, tin, and alloys of those metals. Melting points and boiling points for those metals are as follows:

| Metal | Melting Point | Boiling Point |
| --- | --- | --- |
| Aluminum | 660° C. | 2467° C. |
| Chromium | 1890° C. | 2482° C. |
| Tin | 232° C. | 2270° C. |

While specific materials, apparatus, and processing steps have been set forth for purposes of describing embodiments of the invention, various modifications can be resorted to, in light of the above teachings, without departing from applicant's novel contributions; therefore in determining the scope of the present invention, reference shall be made to the appended claims.

What is claimed is:

1. A method for coating a substrate with a metal coating, comprising passing continuous strip steel through an enclosed elongated furnace having strip entry and strip entry seals, providing a gas atmosphere in said furnace, introducing a vapor phase of a metal to be coated on the strip steel by heating a source of metal for coating, which is in communication with said furnace, to the boiling point of the metal source, forcefully directing said combined gas atmosphere and said metal vapor toward said continuous steel strip, and maintaining said gas atmosphere, metal vapor, and surfaces of said furnace exposed to said gas atmosphere and metal vapor at a temperature greater or equal to the metal source, wherein said continuous strip steel is passed through said furnace at a rate and at an entry temperature such that the continuous strip steel surface temperature is greater than the melting point of the metal for coating and less than the boiling point of the metal for coating, and said metal vapor condenses on the steel to form a molten metal coating.

2. The method for coating a substrate with a metal coating according to claim 1, wherein said metal for coating is selected from the group consisting of zinc, tin, aluminum, chromium, and alloys of those metals.

3. The method for coating a substrate with a metal coating according to claim 1, wherein said gas is selected from the group consisting of nitrogen, helium, hydrogen, and argon.

4. The method for coating a substrate with a metal coating according to claim 1, wherein said furnace atmosphere and surfaces of said furnace which are exposed to said furnace atmosphere are at a temperature greater or equal to said boiling point of said source of metal for coating.

5. The method for coating a substrate with a metal coating according to claim 1, further including providing nozzles for use in providing said gas and utilizing said nozzles to forcefully direct said combination of gas atmosphere and vapor of the metal for coating toward said continuous strip steel.

6. The method for coating a substrate with a metal coating according to claim 1, further comprising, following completion of said coating steps, cooling said source of the metal for coating to below the metal's melting point, then holding the temperature of said source of the metal for coating below the metal's melting point until said source of the coating metal solidifies and said metal vapor in the closed furnace condenses on the solidified source of the metal for coating, then cooling the furnace and enclosed atmosphere to a temperature below the melting point of the source of metal for coating.

7. The method for coating a substrate with a metal coating according to claim 1, further comprising,
holding said continuous strip steel coated with metal at a selected temperature for a selected period of time so as to alloy at least a portion of said metal coating with the material of the continuous strip steel.

8. The method for coating a substrate with a metal coating according to claim 7, wherein said holding step is carried out in said furnace.

9. The method for coating a substrate with a metal coating according to claim 1, wherein said coating metal is zinc, said zinc source is heated to 917° C. and said substrate temperature is greater than 420° C. and less than 917° C.

10. The method for coating a substrate with a metal coating according to claim 1, wherein said coating metal is aluminum, said aluminum source is heated to 2467° C. and said substrate temperature is greater than 660° C. and less than 2467° C.

11. The method for coating a substrate with a metal coating according to claim 1, wherein said coating metal is chromium, said chromium source is heated to 2482° C. and said substrate temperature is greater than 1890° C. and less than 2482° C.

12. The method for coating a substrate with a metal coating according to claim 1, wherein said coating metal is tin, said tin source is heated to 2270° C. and said substrate temperature is greater than 232° C. and less than 2270° C.

13. A method for coating a substrate with a metal coating, comprising
passing continuous strip steel through an enclosed elongated furnace having strip entry and strip exit seals,
providing a gas atmosphere in said furnace,
introducing a vapor phase of a metal to be coated on the strip steel by heating a source of the metal for coating, which is in communication with said furnace, to the boiling point of the metal,
forcefully directing said combined gas atmosphere and metal vapor toward said continuous steel strip, and
maintaining said gas atmosphere, metal vapor and surfaces of said furnace exposed to said gas atmosphere and metal vapor at a temperature greater or equal to the coating metal source temperature, wherein
said continuous strip steel is passed through said furnace at a rate and at an entry temperature such that the continuous strip steel surface temperature is less than the melting point of the metal for coating and said metal vapor sublimates on the steel to form a solid metal coating.

14. The method for coating a substrate with a metal coating according to claim 13, wherein said coating metal is zinc, said zinc source is heated to 917° C. and said substrate temperature is less than 420° C.

15. The method for coating a substrate with a metal coating according to claim 13, wherein said coating metal is aluminum, said aluminum source is heated to 2467° C. and said substrate temperature is less than 660° C.

16. The method for coating a substrate with a metal coating according to claim 13, wherein said coating metal is chromium, said chromium source is heated to 2482° C. and said substrate temperature is less than 1890° C.

17. The method for coating a substrate with a metal coating according to claim 13, wherein said coating metal is tin, said tin source is heated to 2270° C. and said substrate temperature is less than 232° C.

18. The method for coating a substrate with a metal coating according to claim 13, wherein said metal for coating is selected from the group consisting of zinc, tin, aluminum, chromium, and alloys of those metals.

19. The method for coating a substrate with a metal coating according to claim 13, wherein said gas is selected from the group consisting of nitrogen, helium, hydrogen, and argon.

20. The method for coating a substrate with a metal coating according to claim 13, wherein said furnace atmosphere and surfaces of said furnace which are exposed to said furnace atmosphere are at a temperature greater or equal to said boiling point of said source of metal for coating.

21. The method for coating a substrate with a metal coating according to claim 13, further including providing nozzles for use in providing said gas and utilizing said nozzles to forcefully direct said combination of gas atmosphere and vapor of the metal for coating toward said continuous strip steel.

22. The method for coating a substrate with a metal coating according to claim 13, further comprising, following completion of said coating steps,
cooling said source of the metal for coating to below the metal's melting point, then
holding the temperature of said source of the metal for coating below the metal's melting point until said source of the coating metal solidifies and said metal vapor in the closed furnace condenses on the solidified source of the metal for coating, then
cooling the furnace and enclosed atmosphere to a temperature below the melting point of the source of metal for coating.

23. The method for coating a substrate with a metal coating according to claim 13, further comprising,
holding said substrate coated with metal at a selected temperature for a selected period of time so as to alloy at least a portion of said metal coating with the material of the continuous strip steel.

24. The method for coating a substrate with a metal coating according to claim 23, wherein said holding step is carried out in said furnace.

* * * * *